United States Patent [19]
Altschul et al.

[11] Patent Number: 5,965,848
[45] Date of Patent: *Oct. 12, 1999

[54] DISPOSABLE PORTABLE ELECTRONIC DEVICES AND METHOD OF MAKING

[75] Inventors: Randice-Lisa Altschul, 36 Cecilia Ave., Cliffside Park, N.J. 07010; Lee S. Volpe, Collingswood, N.J.

[73] Assignee: Randice-Lisa Altschul, Cliffside Park, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/898,295

[22] Filed: Jul. 22, 1997

[51] Int. Cl.⁶ .............................. H05K 1/00; H05K 3/46
[52] U.S. Cl. ......................... 174/254; 361/749; 361/761
[58] Field of Search ..................... 174/254, 256, 174/268, 253; 361/749, 750, 751, 761

[56] References Cited

U.S. PATENT DOCUMENTS

| | | | |
|---|---|---|---|
| D. 340,714 | 10/1993 | Hoffman | D14/149 |
| D. 369,167 | 4/1996 | Hanson et al. | D14/192 |
| 3,052,823 | 9/1962 | Anderson et al. | |
| 3,248,779 | 5/1966 | Yuska et al. | |
| 3,766,439 | 10/1973 | Isaacson | 317/100 |
| 3,830,979 | 8/1974 | McIntosh | |
| 3,911,234 | 10/1975 | Kotaka | 200/5 A |
| 4,081,898 | 4/1978 | Taylor, Jr. et al. | 29/622 |
| 4,210,870 | 7/1980 | Kalio-Köllö | 455/95 |
| 4,412,272 | 10/1983 | Wedertz et al. | |
| 4,597,635 | 7/1986 | Hoshikawa | 350/334 |
| 4,755,911 | 7/1988 | Suzuki | 361/414 |
| 4,776,000 | 10/1988 | Parienti | 379/62 |
| 4,783,799 | 11/1988 | Maass | 380/43 |
| 4,831,647 | 5/1989 | D'Avello et al. | 379/91 |
| 4,833,568 | 5/1989 | Berhold | |
| 4,856,046 | 8/1989 | Streck et al. | 379/56 |
| 4,881,254 | 11/1989 | Hollewed et al. | 379/144 |
| 4,916,441 | 4/1990 | Gombrich | 340/712 |
| 4,951,308 | 8/1990 | Bishop et al. | 379/91 |

(List continued on next page.)

FOREIGN PATENT DOCUMENTS

| | | |
|---|---|---|
| 2-239695 | 3/1989 | Japan . |
| 2262685 | 6/1993 | United Kingdom . |
| 9216078 | 9/1992 | WIPO . |
| 9603001 | 2/1996 | WIPO . |

*Primary Examiner*—Kristine Kincaid
*Assistant Examiner*—William Silverio
*Attorney, Agent, or Firm*—Arthur Jacob

[57] ABSTRACT

A disposable portable electronic device has a body of prescribed length and thickness and constructed of an elongate, ribbon-like substrate of dielectric material, the substrate having a continuous length much greater than the length of the body, and a thickness much less than the thickness of the body, with conductors and components formed on the substrate, the dielectric material of the substrate having a high degree of flexibility such that the substrate is folded upon itself into at least shorter lengths juxtaposed with one another within the thickness of the body, and the juxtaposed lengths of the substrate are secured together to establish a self-sustaining structure which forms the body of the device.

15 Claims, 10 Drawing Sheets

U.S. PATENT DOCUMENTS

| Patent No. | Date | Inventor | Class |
|---|---|---|---|
| 5,062,916 | 11/1991 | Aufderheide et al. | 156/269 |
| 5,103,375 | 4/1992 | Cottingham et al. | |
| 5,138,650 | 8/1992 | Stahl et al. | 379/61 |
| 5,161,250 | 11/1992 | Ianna et al. | 455/66 |
| 5,220,448 | 6/1993 | Vogel et al. | |
| 5,220,593 | 6/1993 | Zicker et al. | 379/59 |
| 5,225,969 | 7/1993 | Takaya et al. | 361/414 |
| 5,233,642 | 8/1993 | Renton | 379/59 |
| 5,276,418 | 1/1994 | Klosowiak et al. | |
| 5,301,223 | 4/1994 | Amadon et al. | 379/58 |
| 5,307,508 | 4/1994 | Rollins et al. | 455/38.1 |
| 5,327,482 | 7/1994 | Yamamoto | 379/61 |
| 5,359,182 | 10/1994 | Schilling | 235/380 |
| 5,362,656 | 11/1994 | McMahon | |
| 5,365,570 | 11/1994 | Boubelik | 379/59 |
| 5,376,931 | 12/1994 | Marrs | 340/825.44 |
| 5,379,193 | 1/1995 | Gall et al. | 361/784 |
| 5,388,148 | 2/1995 | Seiderman | 379/59 |
| 5,398,163 | 3/1995 | Sano | |
| 5,423,080 | 6/1995 | Perret et al. | 455/90 |
| 5,434,362 | 7/1995 | Klosowiak et al. | |
| 5,438,612 | 8/1995 | Norimatsu | 379/58 |
| 5,448,511 | 9/1995 | Paurus et al. | |
| 5,452,181 | 9/1995 | Eichelberger et al. | |
| 5,461,664 | 10/1995 | Cappadona | 379/58 |
| 5,504,808 | 4/1996 | Hamrick, Jr. | 379/144 |
| 5,509,196 | 4/1996 | Davis et al. | 29/830 |
| 5,511,114 | 4/1996 | Stimson et al. | 379/114 |
| 5,517,555 | 5/1996 | Amadon et al. | 379/59 |
| 5,541,985 | 7/1996 | Ishii et al. | 379/111 |
| 5,550,897 | 8/1996 | Seiderman | 379/59 |
| 5,558,928 | 9/1996 | DiStefano et al. | 428/209 |
| 5,563,934 | 10/1996 | Eda | 379/144 |
| 5,577,100 | 11/1996 | McGregor et al. | 379/58 |
| 5,577,109 | 11/1996 | Stimson et al. | 379/112 |
| 5,579,379 | 11/1996 | D'Amico et al. | 379/112 |
| 5,579,574 | 12/1996 | Colleran et al. | 29/840 |
| 5,583,918 | 12/1996 | Nakagawa | 379/61 |
| 5,592,537 | 1/1997 | Moen | 379/67 |
| 5,608,778 | 3/1997 | Partridge, III | 379/58 |
| 5,615,087 | 3/1997 | Wieloch | 361/719 |
| 5,615,260 | 3/1997 | Kurgan | 379/433 |
| 5,621,787 | 4/1997 | McKoy et al. | 379/144 |
| 5,625,669 | 4/1997 | McGregor et al. | 379/58 |
| 5,627,886 | 5/1997 | Bowman | 379/111 |
| 5,629,977 | 5/1997 | Fonseca | 379/144 |
| 5,631,947 | 5/1997 | Wittstein et al. | 379/59 |
| 5,673,306 | 9/1997 | Amadon et al. | 379/59 |
| 5,673,309 | 9/1997 | Woynoski et al. | 379/144 |
| 5,675,636 | 10/1997 | Gray | 379/114 |
| 5,677,945 | 10/1997 | Mullins et al. | 379/91 |
| 5,684,861 | 11/1997 | Lewis et al. | 379/59 |

DISPOSABLE PORTABLE ELECTRONIC DEVICES AND METHOD OF MAKING

The present invention relates generally to portable electronic devices and pertains, more specifically, to the construction of disposable portable electronic devices.

Portable electronic devices are becoming more prevalent as technological innovations bring a wider variety of such devices into practical use by more and more individuals. Thus, for example, improved cellular communication services have created a demand for more and less expensive cellular telephones. Pagers have become ubiquitous in maintaining contact with individuals in the field. Various transponders are available for enabling individuals to determine their location, and as navigational aids. Numerous portable electronic devices are offered for a myriad of business, commercial and entertainment purposes.

The present invention enables the economical manufacture of the above available electronic devices, as well as further portable electronic devices, so as to render the devices easier to purchase and use and, in that way, more readily available to a wider audience. As such, the present invention attains several objects and advantages, some of which are summarized as follows: Enables relatively inexpensive manufacture of portable electronic devices, rendering the devices readily expendable; provides a highly compact construction for rendering electronic devices more conveniently portable; enables the construction of effective electronic circuitry within a more compact and efficient structure; simplifies the manufacture of portable electronic devices in a variety of readily disposable constructions; provides a unique construction for portable electronic devices which are convenient to vend, use and discard; enables the manufacture of simplified portable electronic devices in large numbers of consistently high quality capable of reliable operation over a predictable service life.

The above objects and advantages, as well as further objects and advantages, are attained by the present invention which may be described briefly as an improvement in a disposable portable electronic device having a body of prescribed length, width and thickness and circuitry including conductors and components, the improvement comprising: an elongate, ribbon-like substrate of dielectric material, the substrate having a continuous length much greater than the prescribed length of the body, a thickness much less than the prescribed thickness of the body, and opposite faces; at least some of the conductors and some of the components being formed on the substrate; the dielectric material of the substrate having a high degree of flexibility such that at least the length of the substrate is folded upon itself into shorter lengths within the prescribed length of the body, with the shorter lengths juxtaposed with one another within the prescribed thickness of the body; the juxtaposed lengths of the substrate being secured together to establish a self-sustaining structure which forms the body of the device.

In addition, the invention includes an improvement in a method for making a disposable portable electronic device having a body of prescribed length, width and thickness and circuitry including conductors and components, the method comprising: forming at least some of the conductors and some of the components on an elongate, ribbon-like substrate of dielectric material, the substrate having a continuous length much greater than the prescribed length of the body, a thickness much less than the prescribed thickness of the body, opposite faces, and a high degree of flexibility; folding the substrate upon itself into shorter lengths within the prescribed length of the body, with the shorter lengths juxtaposed with one another within the prescribed thickness of the body; and securing together the juxtaposed lengths of the substrate to establish a self-sustaining structure which forms the body of the device.

The invention will be understood more fully, while still further objects and advantages will become apparent, in the following detailed description of preferred embodiments of the invention illustrated in the accompanying drawing, in which.

Figure 1:
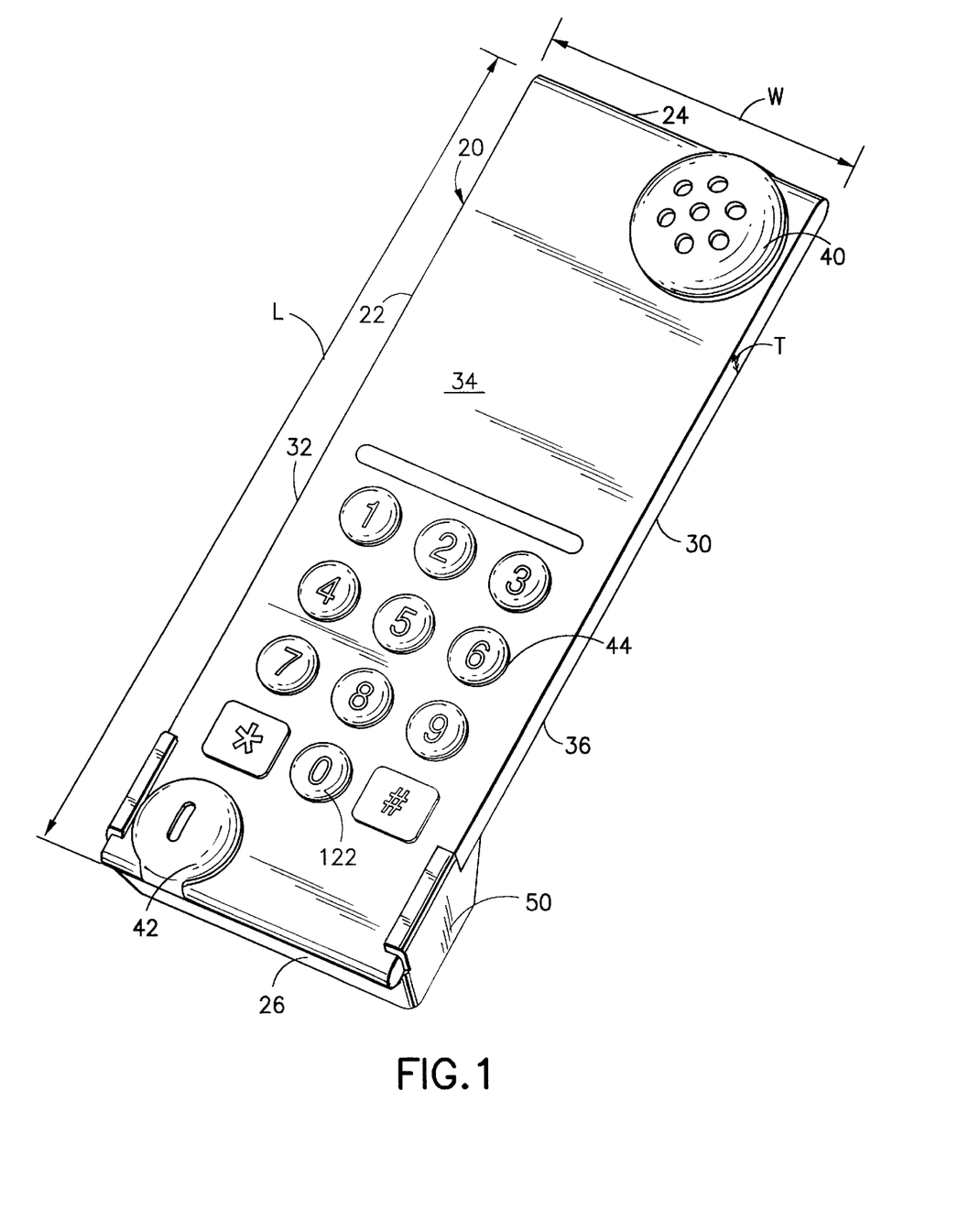
FIG. 1 is a pictorial perspective view of a disposable portable electronic device in the form of a wireless telephone constructed in accordance with the present invention.

Referring now to the drawing, and especially to FIG. 1 thereof, a disposable portable electronic device constructed in accordance with the present invention is shown in the form of a wireless telephone 20 having a body 22 of prescribed length L, width W and thickness T. Length L extends longitudinally between a first end 24 and a second end 26, width W extends between laterally opposite sides 30 and 32, and thickness T lies between front face 34 and back face 36. An earphone assembly 40 is connected to body 22 at the first end 24, preferably offset toward one side 30 of the body 22, and a microphone assembly 42 is connected to the body 22 at the second end 26. A keypad 44 is located at the front face 34 and a power battery 46 (see FIG. 5) is housed within a battery housing 50 attached to the body 22 at the rear face 36. The body 22 is relatively thin between the front face 34 and the rear face 36; however, the construction of the body 22, as set forth in detail below, provides the body 22 with a mechanical stiffness and strength which enables the telephone 20 to be hand held during use in telephonic communication. Details of the circuitry and operation of telephone 20 are similar to those disclosed in earlier pending applications Ser. No. 08/808,339, filed Feb. 28, 1997, and Ser. No. 08/844,149, filed May 7, 1997, both of which applications are incorporated herein by reference thereto.

Turning now to FIGS. 2 through 5, the process by which telephone 20 is manufactured is shown in a series of diagrammatic illustrations which also disclose the structure of the body 22 of the telephone 20. In essence, the body 22 is constructed of a single, relatively long and thin ribbon-like substrate which carries the circuitry of the telephone 20 and which is folded into the configuration of the body 22 to establish a self-sustaining structure which serves as the body 22 itself. The relatively long length of the substrate provides a very much expanded area for a circuit trace, enabling the formation of a continuous circuit throughout a circuit trace area, and the highly flexible nature of the thin substrate allows the substrate to be folded into a many-layered, self-sustaining structure, all of which renders the manufacture of the completed device simple enough and inexpensive enough to render the device expendable and readily disposable.

Figure 2:
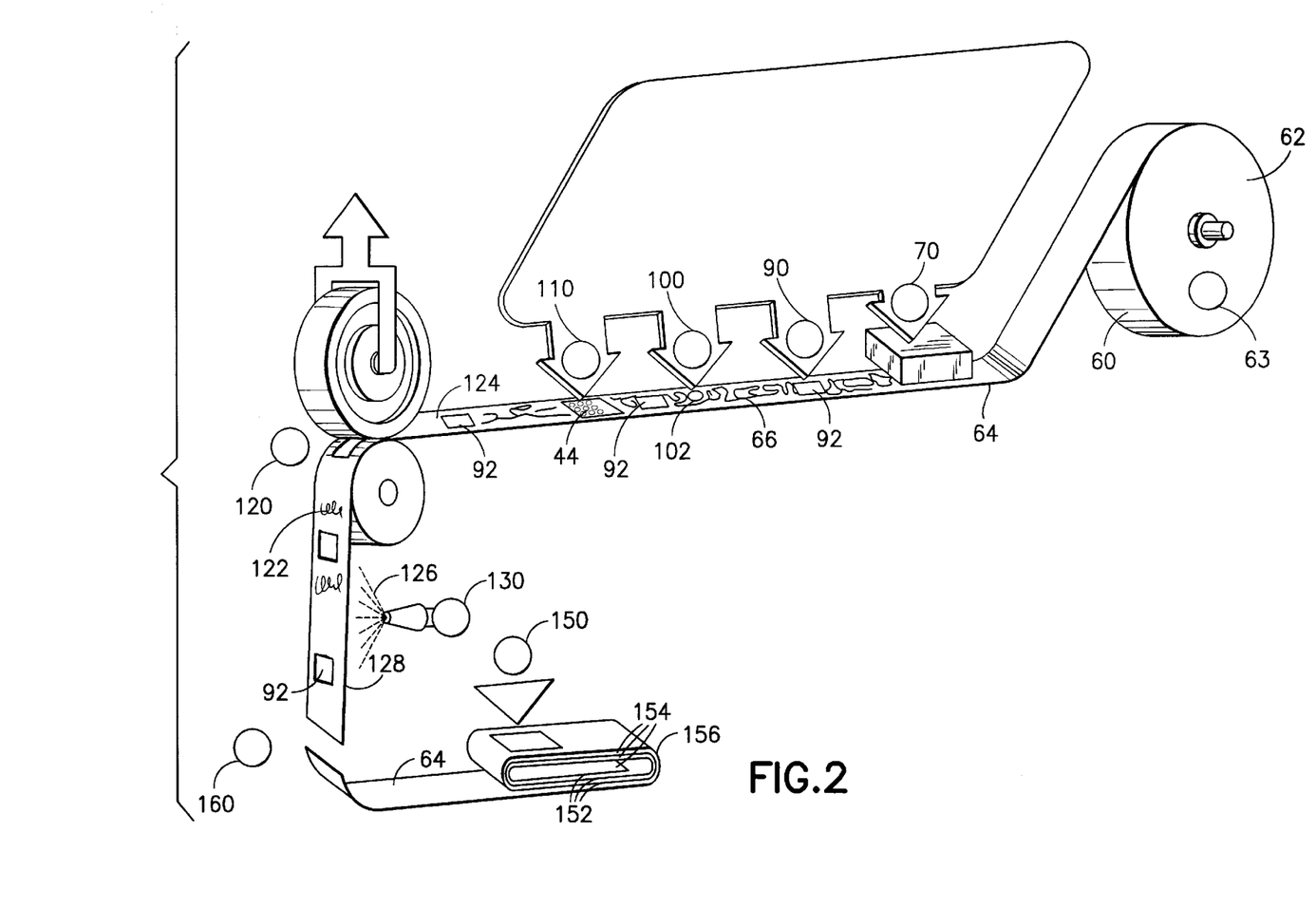
FIGS. 2 through 5 are a diagrammatic illustrations of successive portions of a process by which the device of FIG. 1 is manufactured in accordance with the invention.

Thus, as seen in FIG. 2, material 60 is supplied from a supply roll 62 located at a station 63 to provide a ribbon-like substrate 64 of a dielectric material of predetermined width and thickness, and indeterminate length. A circuit trace 66, which includes conductors and at least some components of the telephone circuit, is formed on the substrate 64, by a now well-known process generally referred to as "printing" the circuit trace. Such "printing" usually is carried out by either a subtractive process or by an additive process. In a subtractive process, the substrate is coated with a vacuum deposited metallic conductive coating over which is there is coated a photosensitive medium. The circuit trace 66 then is created by etching away portions of the conductive coating so that the desired circuit trace 66 remains on the substrate 64. In an additive process, a conductive material is applied to the substrate 64 in the pattern required for the circuit trace 66.

Figure 3:
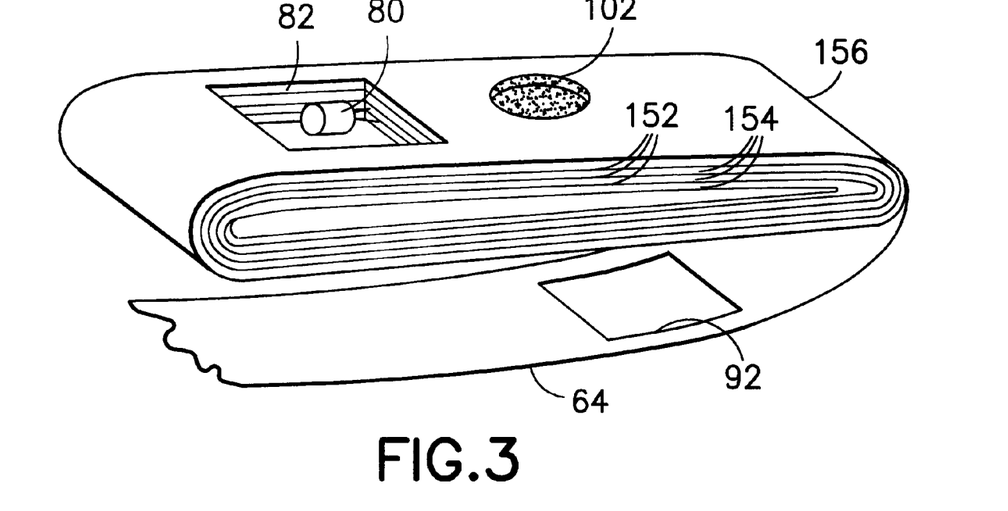

In the illustrated process of the present invention, circuit trace 66 is formed on the substrate 64 as the substrate 64 passes through a station 70, preferably by "printing" the circuit trace 66 on the substrate 64, as described above. Since not all of the elements of the circuitry of telephone 20 are amenable to printing, provision is made for accommodating those components of the circuitry which cannot be printed on the substrate 64. Some of these components, such as crystals and capacitors, for example, are as thin or thinner than the thickness T of the telephone 20, and are accommodated by placing these components in a cavity formed in the body 22 of the telephone 20, as shown in FIG. 3 which is an enlarged detail of a portion of FIG. 2 and wherein there is illustrated the placement of a component 80 within a cavity in the form of an aperture 82 established in the body 22 of the telephone 20. Accordingly, at a station 90, shown in FIG. 2, openings 92 are punched through the substrate 64 and are located along the substrate 64 so that the openings 92 are registered with one another in the completed body 22 to form the aperture 82.

The printed and punched substrate 64 is advanced from stations 70 and 90 to a subsequent station 100 where certain other components, also not amenable to printing, are bonded to the substrate 64, in appropriate electrical contact with the circuit trace 66. Thus, for example, certain integrated circuits, known as "dies" are thin enough to be placed on the substrate 64 without the necessity for an aperture 82. One such die is illustrated at 102 in FIGS. 2 and 3. At a further subsequent station 110, surface mounted components, such as keypad 44, are mounted to the substrate 64, juxtaposed with appropriate portions of the circuit trace 66.

The substrate 64 continues to be advanced and passed through a graphics station 120 where selected graphics 122 are applied to the substrate 64. In the preferred arrangement illustrated in FIG. 2, the circuit trace 66 is printed on only one face 124 of the substrate 64 and an adhesive 126 is applied to opposite face 128 of the substrate 64, at a subsequent station 130. The substrate 64 then is advanced to a folding station 150 where the substrate 64 is folded upon itself into a relatively compact configuration in which shorter lengths 152 of the substrate 64 are juxtaposed with one another within the confines of the prescribed length L of the telephone 20. The folding of the substrate 64 preferably is accomplished by winding the substrate 64 upon itself so that the material of the substrate 64 itself serves as an insulating barrier between the juxtaposed portions 154 of the circuit trace 66 in the folded structure 156. The folded structure 156 then is severed from the indeterminate length fed from supply roll 62, as shown at station 160, and the folded structure 156 is compressed, as shown diagrammatically in FIG. 4, at a further station 158, to bring the thickness of the folded structure 156 within the prescribed thickness T. The shorter lengths 152 are secured together by the adhesive 126 applied to the face 128 of the substrate 64 so that the shorter lengths 152 are laminated together to establish a self-sustaining structure 160. The self-sustaining structure 160 is a multiple-layered construction having a relatively high degree of stiffness as compared to the ribbon-like flexible substrate 64. Typically, substrate 64 is a thin ribbon of a synthetic polymeric material, such as a strip of Mylar having a thickness of about four to five mils and a width of about two inches. Currently available wireless telephones employ printed circuit boards having a width of about two inches and a length of about five and one-half inches. Within those dimensions, a substrate 64 of five-hundred inches provides about one-hundred times the circuit area of such conventional printed circuit boards and is folded into approximately one-hundred shorter lengths 152 compressed and laminated into a self-sustaining structure 160 having a thickness of about one-half inch.

Figure 5:
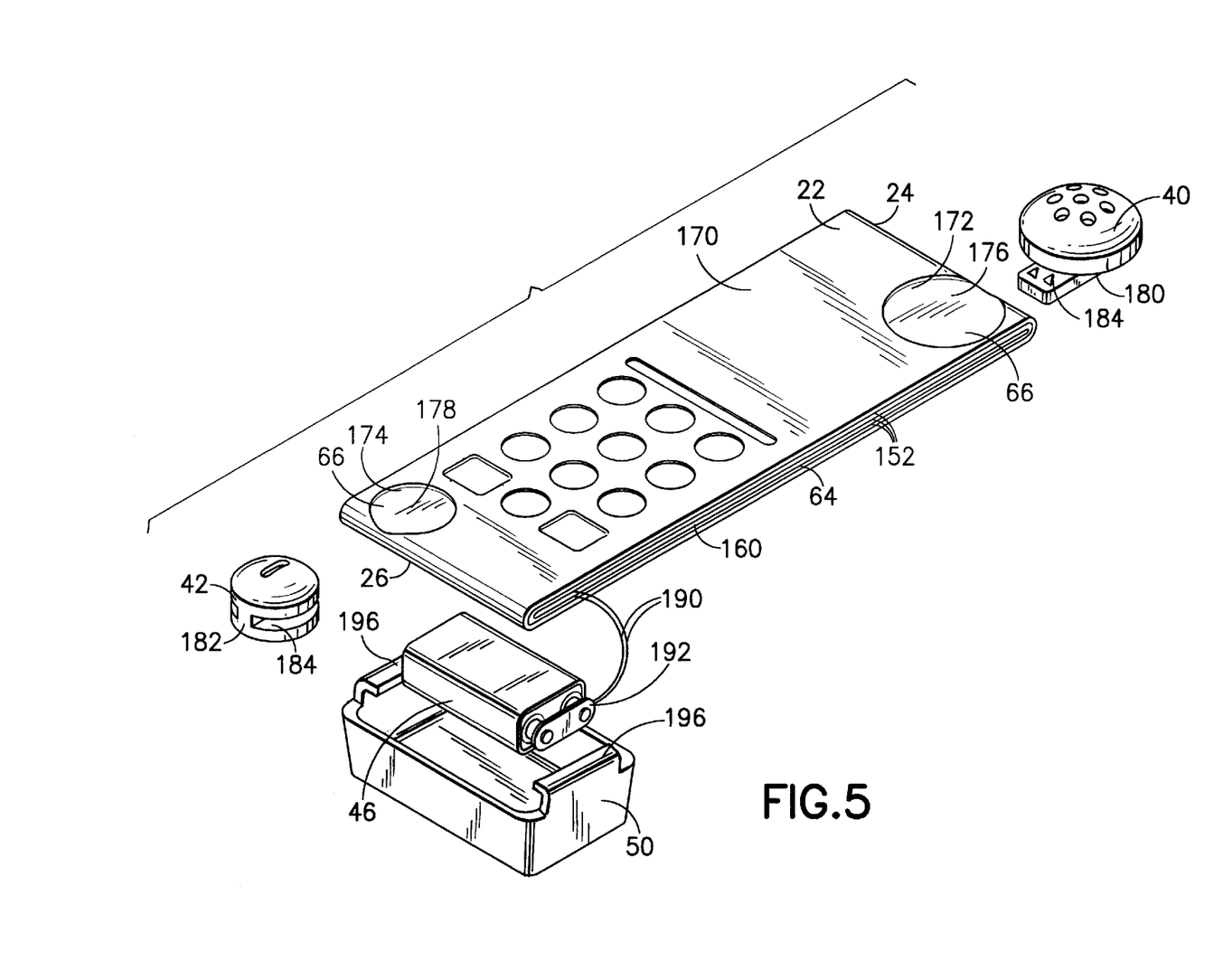

As best seen in FIG. 5, subsequent to compressing to form the self-sustaining structure 160, a sheath 170 of synthetic polymeric material preferably is placed over the structure 160 to complete the body 22 of the telephone 20. Sheath 170 includes openings 172 and 174 which expose corresponding portions 176 and 178 of the circuit trace 66 for contact with further components edge-mounted upon the laminated structure 160. The earphone assembly 40 and the microphone assembly 42 then are clipped onto the structure 160, over the exposed corresponding portions 176 and 178, to be secured in place in the body 22 of the telephone 20, in contact with the circuit trace 66. To that end, the earphone assembly 40 and the microphone assembly 42 include clip-like housings 180 and 182, the housings 180 and 182 each having barbs 184 for securing the housings 180 and 182 in place, while assuring appropriate electrical contact. Battery leads 190 extend from the structure 160 and carry a battery connector 192 which is connected to battery 46 housed within battery housing 50 which is slipped over the end 26 of the body 22 and held in place by securing lips 196 on the battery housing 50. The completed wireless telephone 20 thus is manufactured in a relatively inexpensive and expendable construction, economically available to a wide audience and readily disposable upon completion of a predetermined service life.

Figure 6:
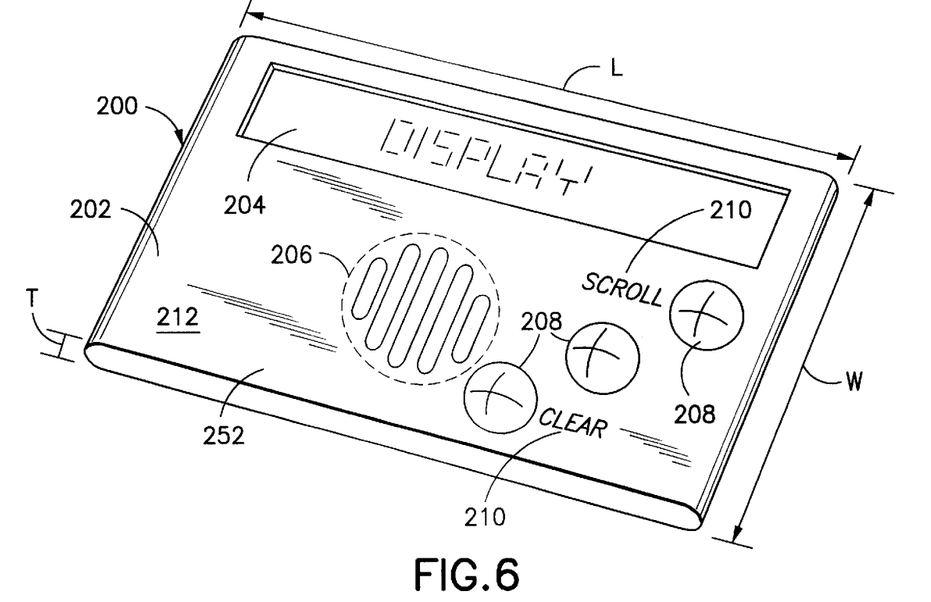
FIG. 6 is a pictorial perspective view of another disposable portable electronic device in the form of a pager constructed in accordance with the invention.
Figure 7:
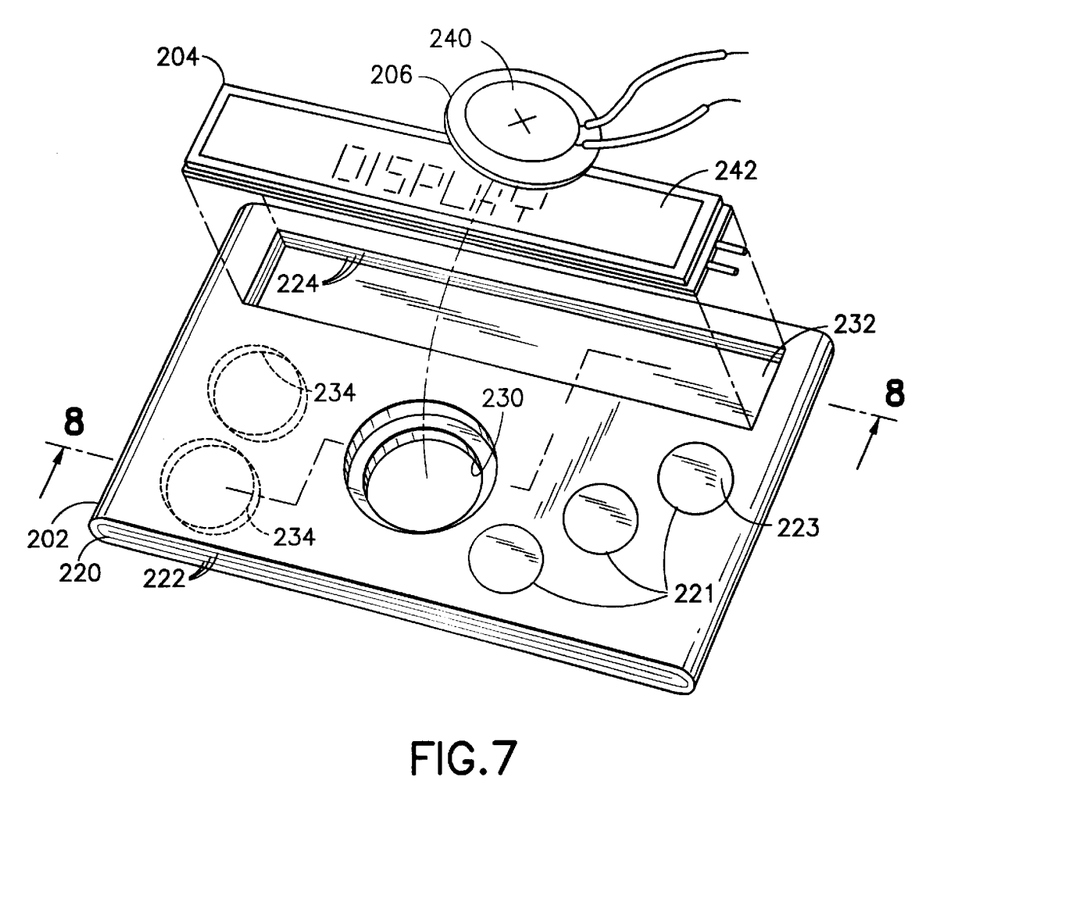
FIG. 7 is a diagrammatic illustration of component parts of the pager, showing the manner in which the device is constructed.
Figure 8:
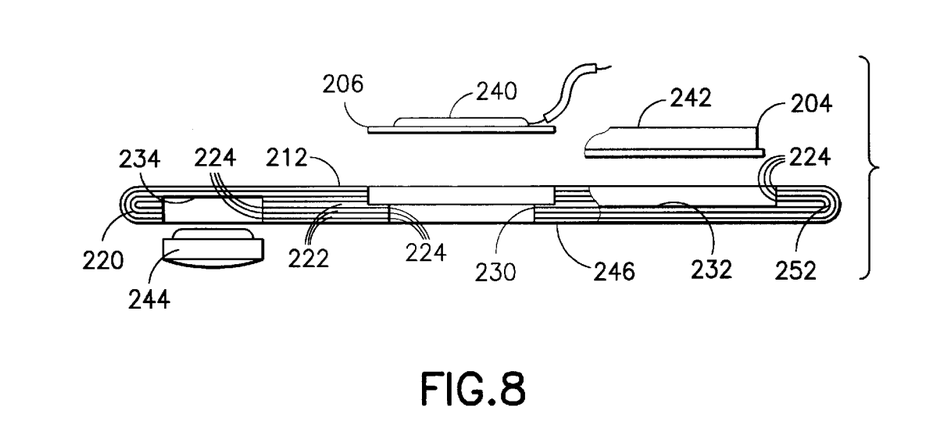
FIG. 8 is a cross-sectional view taken along line 8—8 of FIG. 7.
Figure 9:
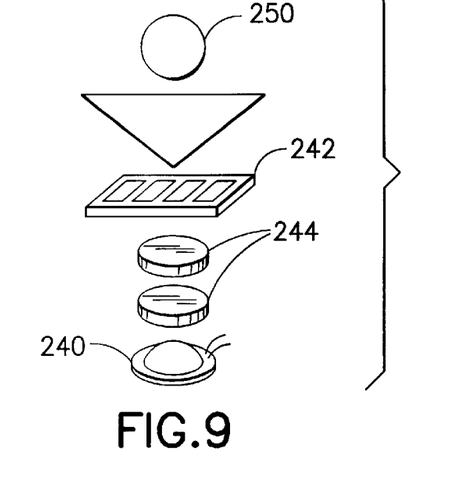
FIG. 9 is diagrammatic illustration, similar to FIGS. 2 through 5, and showing a portion of the process by which the pager of FIG. 6 is manufactured in accordance with the invention.

Turning now to FIGS. 6 through 8, another portable electronic device constructed in accordance with the invention is shown in the form of a pager 200. Similar to the construction of telephone 20 described above, pager 200 includes a body 202 having a prescribed length L, width W and thickness T, all providing a relatively compact structure. As is common in pagers, pager 200 includes a display 204, a sounding device 206, and operating keys 208. Graphics 210 are carried on the front face 212 of the pager 200. As best seen in FIGS. 7 and 8, body 202 is constructed in the manner described in connection with FIGS. 2 through 4 above; that is, an elongate, flexible, ribbon-like substrate 220 carries the circuitry of the pager 200 and is wound upon itself into relatively stiff body 202 having multiple shorter lengths 222 secured to one another within the prescribed length L of the body 202. The operating keys 208 are surface mounted, as described above in connection with the mounting of keypad 44, on portions 221 of circuit trace 223. Openings 224 were punched in the substrate 220, in the manner described above in connection with the punching of openings 92, and the openings 224 registered to establish cavities in the form of an aperture 230 and recesses 232 and 234, aperture 230 passing through all of the juxtaposed shorter lengths 222 and recesses 232 and 234 passing through only some of the shorter lengths 222. Sounding device 206 is shown in the form of a piezo element 240 inserted into aperture 230 and connected to the circuitry of the pager 200 in a manner somewhat similar to that described above in connection with the placement of component 80. Display 204 is illustrated in the form of an LCD display 242 inserted into recess 232, from the front face 212, and batteries 244 are inserted into recesses 234, from back face 246. Insertion of the piezo element 240, the LCD display 242, and the batteries 244 is accomplished at a further station illustrated at 250 in FIG. 9. Subsequently, a sheath 252, preferably of a clear synthetic polymeric material, is fitted over the assembled elements to complete the pager 200.

The construction of pager 200 enables a highly compact structure which is exceptionally portable and easy to use. Thus, pager 200 readily is constructed with a length L of about four inches, a width W of about two and one-half inches, and a thickness of only about 0.04 inch.

Figure 10:
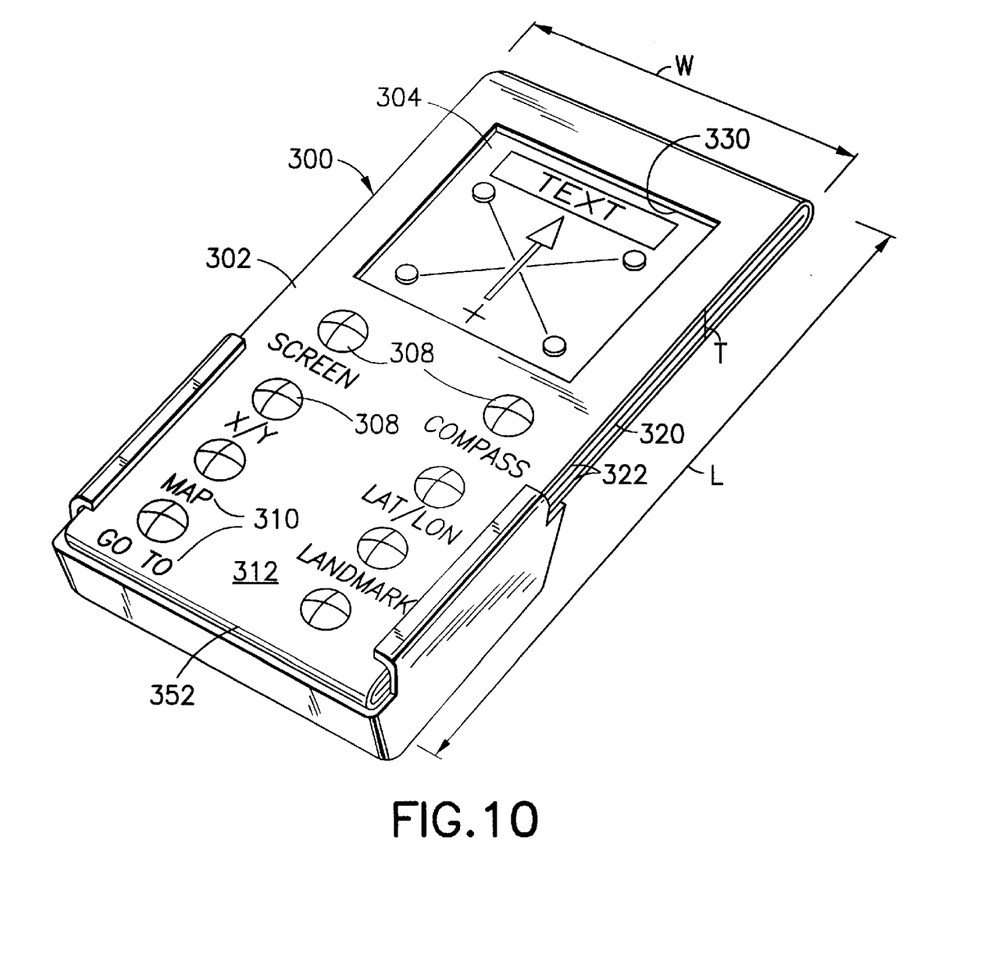
FIG. 10 is a pictorial perspective view of still another disposable portable electronic device in the form of a transponder constructed in accordance with the invention.
Figure 11:
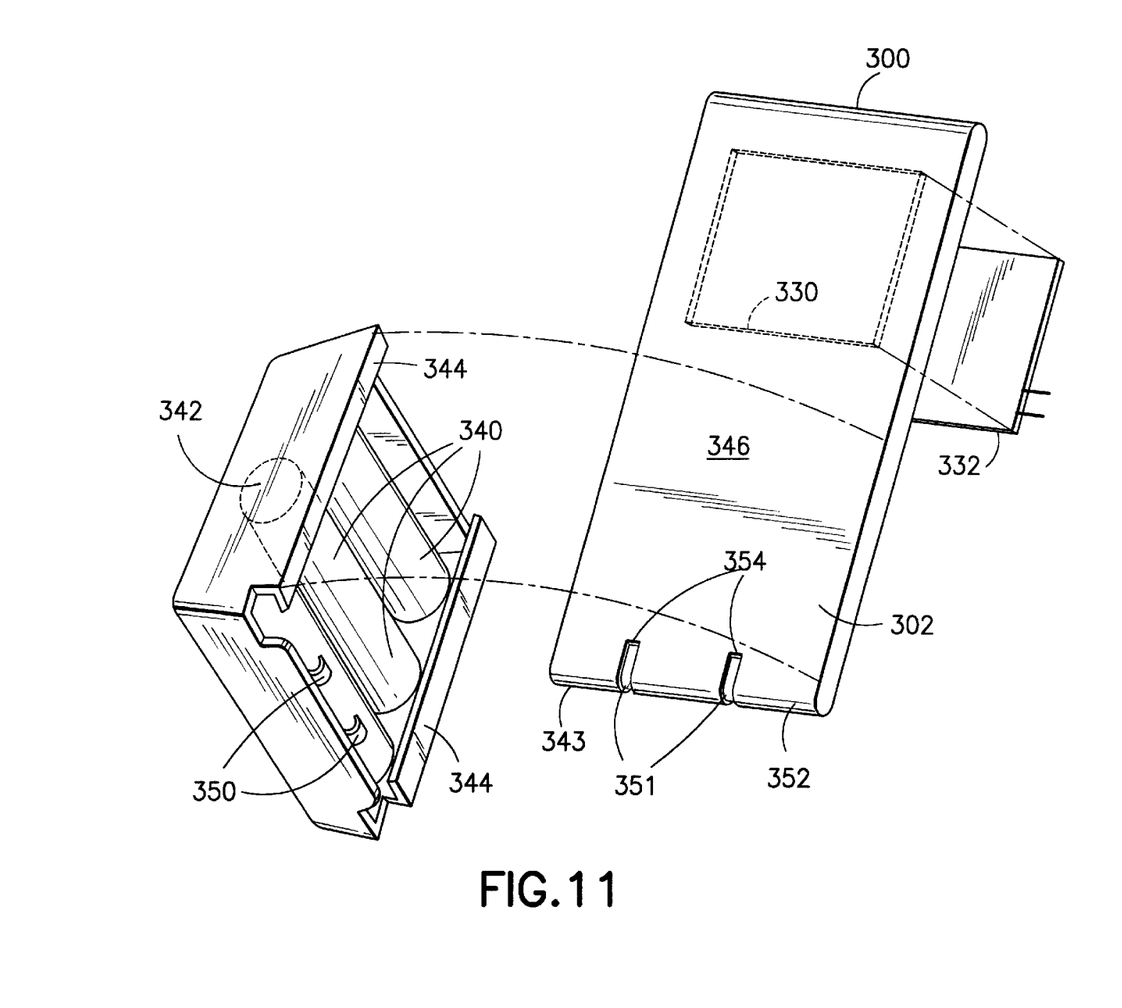
FIG. 11 is a diagrammatic illustration of component parts of the transponder, showing the manner in which the device is constructed.

Referring now to FIGS. 10 and 11, another portable electronic device constructed in accordance with the invention is shown in the form of a transponder 300. Similar to the construction of telephone 20 described above, transponder 300 includes a body 302 having a prescribed length L, width W and thickness T, all providing a relatively compact structure. As is common in transponders, transponder 300 includes a display 304, and operating keys 308. Graphics 310 are carried on the front face 312 of the transponder 300. Body 302 is constructed in the manner described in connection with FIGS. 2 through 4 above; that is, an elongate, flexible, ribbon-like substrate 320 carries the circuitry of the transponder 300 and is wound upon itself into relatively stiff body 302 having multiple shorter lengths 322 secured together within the prescribed length L of the body 302. Openings were punched in the substrate 320, in the manner described above in connection with the punching of openings 92, and the openings registered to establish a cavity in the form of a recess 330 passing through only some of the shorter lengths 322. Display 304 is illustrated in the form of an LCD display 332 inserted into recess 330, from the front face 312, and connected to the circuitry on the substrate 320, as described above. Batteries 340 are carried in a battery housing 342 slipped over the end 343 of the body 302 and held in place by securing lips 344 on the battery housing 342, against back face 346. Electrical connector elements 350 engage portions 351 of the circuitry on the substrate 320 when the battery housing 342 is in place on the body 302. As before, a sheath 352, preferably of a clear synthetic polymeric material, is fitted over the folded substrate 320 to complete the transponder 300, the sheath 352 including slots 354 which expose portions 351 for contact by connector elements 350.

The construction of transponder 300 enables a highly compact structure which is exceptionally portable and easy to use. Thus, transponder 300 readily is constructed with a length L of just over four inches, a width W of just over two and one-half inches, and a thickness of only about 0.04 inch.

Figure 12:
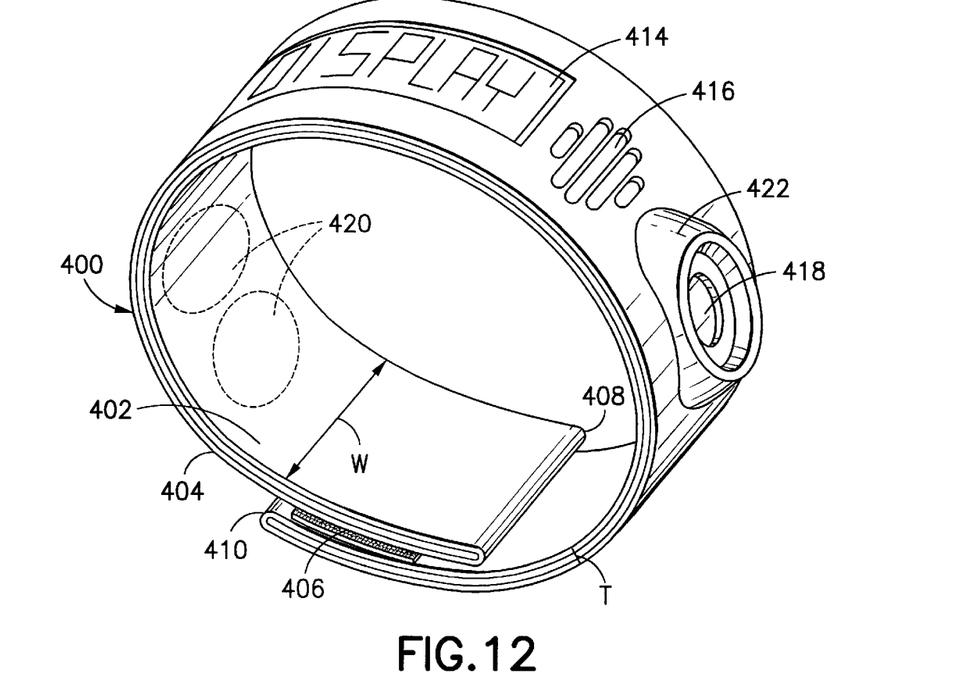
FIG. 12 is a pictorial perspective view of yet another disposable portable electronic device in the form of a child's locator/transponder constructed in accordance with the invention.

In FIG. 12 there is illustrated a child's locator/transponder 400 constructed in accordance with the invention. Locator/transponder 400 includes a body 402 constructed in the form of a bracelet having a somewhat flexible, essentially annular band 404 held in place on a child's wrist by means of a hook-and-loop fastener 406, which allows for adjustment to accommodate the size required for a particular child. Body 402 has a prescribed length between ends 408 and 410, width W and thickness T, all providing a relatively compact structure. Locator/transponder 400 includes an LCD display 414, a piezo sounding device 416, and an operating key 418, and is powered with batteries 420 inserted into the band 406 in a manner similar to that described above in connection with pager 200. In much the same manner as using a pager, a parent can alert the child through the sounding device 416 and leave a message on the display 414. The child may respond by actuating the operating key 418 to send a signal to the parent. The procedure also serves to locate the child. A guard 422 protects against inadvertent actuation of the operating key 418.

Figure 4:
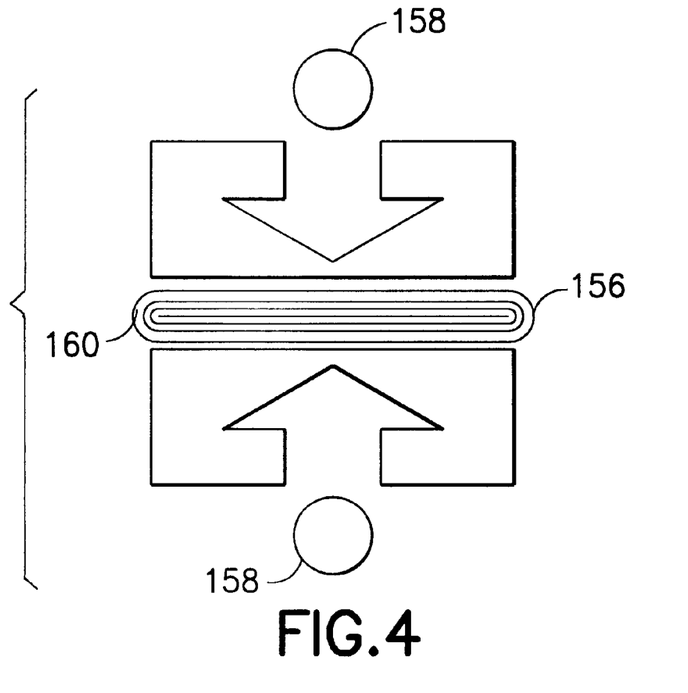

Body 402 is constructed in the manner described in connection with FIGS. 2 through 4 above; that is, an elongate, flexible, ribbon-like substrate carries the circuitry of the locator/transponder 400 and is wound upon itself into body 402 having multiple shorter lengths within the prescribed length of the body 402. However, instead of compressing the multiple shorter lengths into the more-or-less planar, flat body of telephone 20, pager 220 or transponder 300, the body 402 of locator/transponder 400 is formed into the essentially annular bracelet configuration of band 404, with the bracelet configuration having some resiliency, or springiness, to accommodate for different sizes, as set forth above.

Figures 13, 14:
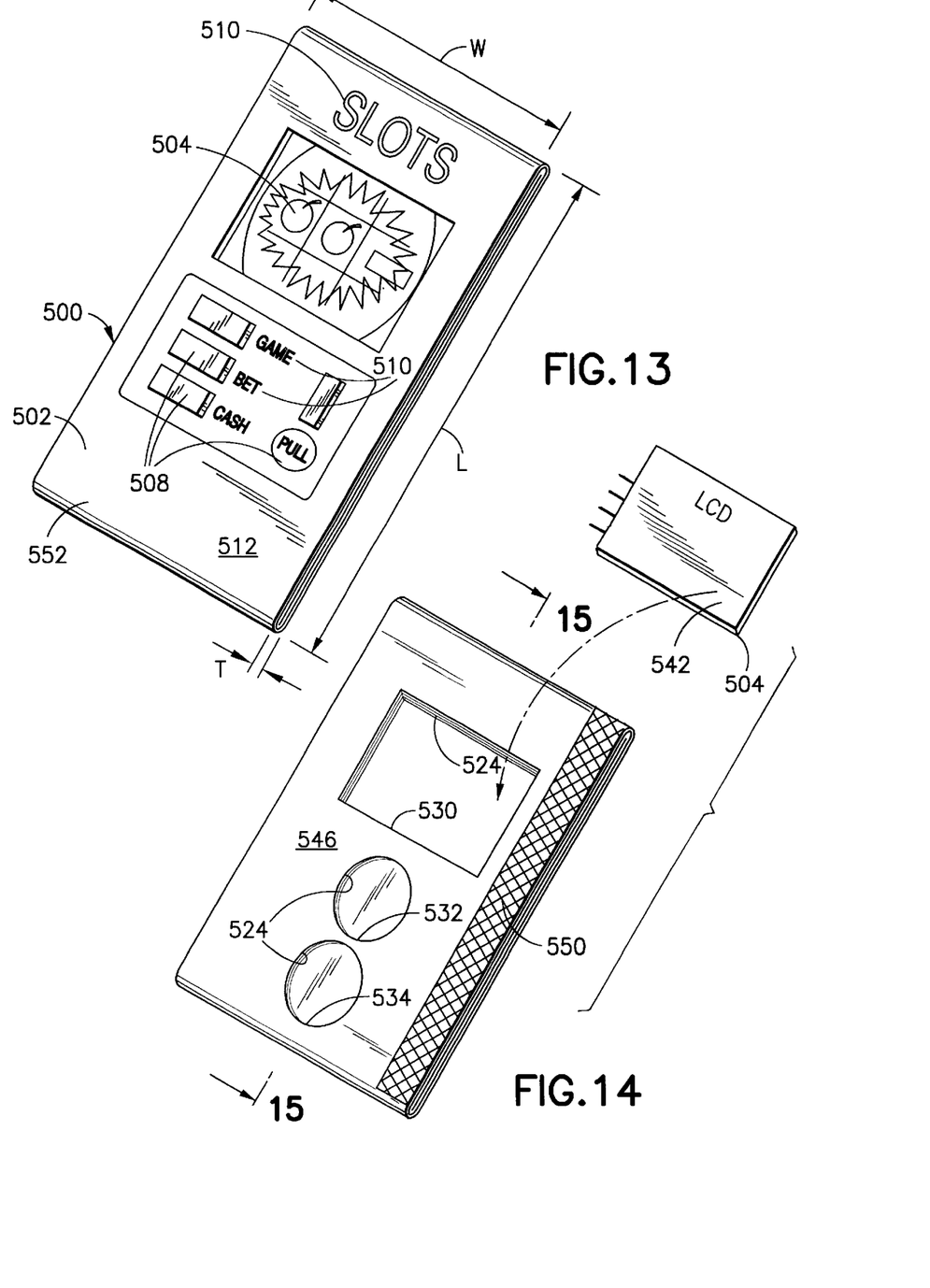
FIG. 13 is a pictorial perspective view of another disposable portable electronic device in the form of a gaming card constructed in accordance with the invention.
FIG. 14 is another pictorial perspective view of the gaming card.
Figure 15:
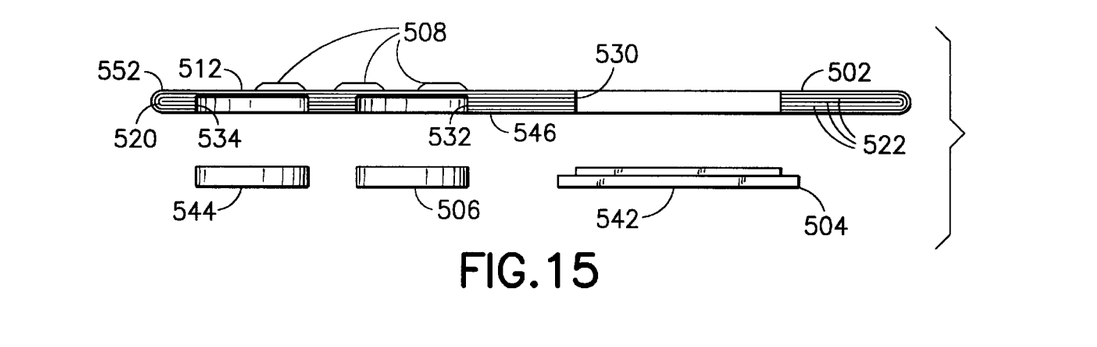
FIG. 15 is a cross-sectional view taken along line 15—15 of FIG. 14.

Turning now to FIGS. 13 through 15, a portable electronic entertainment device in the form of a gaming card 500 is constructed in accordance with the invention and includes a body 502 having a prescribed length L, width W and thickness T, all providing a relatively compact structure. Gaming card 500 includes a display 504, a piezo sounding device 506 and operating keys 508. Graphics 510 are carried on the front face 512 of the gaming card 500. As best seen in FIGS. 13 and 14, body 502 is constructed in the manner described in connection with FIGS. 2 through 4 above; that is, an elongate, flexible, ribbon-like substrate 520 carries the circuitry of the gaming card 500 and is wound upon itself into relatively stiff body 502 having multiple shorter lengths 522 within the prescribed length L of the body 502. The operating keys 508 are surface mounted, as described above in connection with the mounting of keypad 44. Openings 524 were punched in the substrate 520, in the manner described above in connection with the punching of openings 92, and the openings 524 registered to establish cavities in the form of an aperture 530 and recesses 532 and 534, aperture 530 passing through all of the juxtaposed shorter lengths 522, and recesses 532 and 534 passing through only some of the shorter lengths 522. Display 504 is illustrated in the form of an LCD display 542 inserted into recess 532, the piezo sounding device 506 is inserted into the recess 532, and a battery 544 is inserted into recess 534, all from back face 546. A magnetic strip 550 is placed on the back face 546 and is connected to the circuitry carried by the substrate 520, and a sheath 552 envelops the substrate 520, as before.

The above construction enables gaming card 500 to be constructed in the form of a credit card-sized hand-held device, allowing the device to be purchased at any one of a variety of vending outlets. A player may play the games to the extent programmed into the gaming card 500. The gaming card 500 may be inserted into an automated terminal which will read the results of the play, via the magnetic strip 550, for effecting a payout. Once depleted, the card 500 is readily discarded.

It will be apparent that the present invention attains the several objects and advantages summarized above; namely: Enables relatively inexpensive manufacture of portable electronic devices, rendering the devices readily expendable; provides a highly compact construction for rendering electronic devices more conveniently portable; enables the construction of effective electronic circuitry within a more compact and efficient structure; simplifies the manufacture of portable electronic devices in a variety of readily disposable constructions; provides a unique construction for portable electronic devices which are convenient to vend, use and discard; enables the manufacture of simplified portable electronic devices in large numbers of consistently high quality capable of reliable operation over a predictable service life.

It is to be understood that the above detailed description of preferred embodiments of the invention is provided by way of example only. Various details of design, construction and procedure may be modified without departing from the true spirit and scope of the invention, as set forth in the appended claims.

The embodiments of the invention in which an exclusive property or privilege is claimed are defined as follows:

1. An improvement in a disposable portable electronic device having a body of prescribed length, width and thickness, a desired mechanical stiffness, and circuitry including conductors and components, the improvement comprising;

an elongate, ribbon-like substrate of dielectric material, the substrate having a continuous length many times greater than the prescribed length of the body, a thickness many times less than the prescribed thickness of the body, and opposite faces;

at least some of the conductors and some of the components being formed on the substrate, the formed conductors and components being formed on only one of the faces of the substrate and extending along a length of the substrate many times greater than the prescribed length of the body of the electronic device;

the ribbon-like substrate of dielectric material having a high degree of flexibility such that at least the length of the substrate is folded tightly upon itself into at least several shorter lengths within the prescribed length of the body, with the at least several shorter lengths juxtaposed with one another for securement to one another over the shorter lengths within the prescribed thickness of the body and with the formed conductors and components including portions extending along each of at least several of the shorter lengths of the substrate so as to be juxtaposed with one another;

the juxtaposed shorter lengths of the substrate being secured together along the juxtaposed shorter lengths to establish a multiple-layered self-sustaining structure having a high degree of stiffness, as compared to the flexibility of the ribbon-like substrate, which structure, in and of itself, forms the body of the device, with the juxtaposed portions of the formed conductors and components electrically insulated from one another within the structure and the high degree of stiffness of the structure providing the desired mechanical stiffness of the body.

2. The invention of claim 1 wherein the substrate has a width corresponding to the prescribed width of the body.

3. The invention of claim 1 wherein the juxtaposed lengths of the substrate are laminated together.

4. The invention of claim 1 wherein the formed conductors and components are printed upon the one of the faces of the substrate.

5. The invention of claim 4 wherein the substrate is folded so as to be wound upon itself within the shorter lengths, with the one of the faces of the substrate confronting the other of the faces of the substrate along the shorter lengths and the material of the substrate electrically insulating the juxtaposed portions of the printed conductors and components from one another.

6. The invention of claim 1 including openings in the substrate, the openings being spaced from one another along the length of the substrate for registration with one another in the juxtaposed shorter lengths to establish at least one cavity in the folded substrate, and at least one of the components of the circuitry being located within the cavity.

7. The invention of claim 1 wherein others of the components of the circuitry are mounted externally upon the folded substrate.

8. The invention of claim 1 including an external sheath over the folded substrate.

9. In a method for making a disposable portable electronic device having a body of prescribed length, width and thickness, a desired mechanical stiffness, and circuitry including conductors and components, the method comprising:

forming at least some of the conductors and some of the components on an elongate, ribbon-like substrate of dielectric material, the ribbon-like substrate having a continuous length many times greater than the prescribed length of the body, a thickness many times less than the prescribed thickness of the body, opposite faces, and a high degree of flexibility, the formed conductors and components being formed on only one of the faces of the substrate and extending along a length of the substrate many times greater than the prescribed length of the body of the electonic device;

folding the substrate tightly upon itself into at least several shorter lengths within the prescribed length of the body, with the at least several shorter lengths juxtaposed with one another for securement to one another over the shorter lengths within the prescribed thickness of the body and with the formed conductors and components including portions extending along each of at least several of the shorter lengths of the substrate so as to be juxtaposed with one another; and securing together the juxtaposed shorter lengths of the substrate along the juxtaposed shorter lengths to establish a multiple-layered self-sustaining structure having a high degree of stiffness, as compared to the flexibility of the ribbon-like substrate, which structure, in and of itself, forms the body of the device, with the juxtaposed portions of the formed conductors and components electrically insulated from one another within the structure and the high degree of stiffness of the structure providing the desired mechanical stiffness of the body.

10. The invention of claim 9 wherein the juxtaposed lengths of the substrate are secured together by laminating the juxtaposed lengths together.

11. The invention of claim 1 wherein the formed conductors and components are formed by printing upon the one of the faces of the substrate.

12. The invention of claim 11 wherein the substrate is folded by being wound upon itself within the shorter lengths, with the one of the faces of the substrate confronting the other of the faces of the substrate along the shorter lengths and the material of the substrate electrically insulating the juxtaposed portions of the printed conductors and components from one another.

13. The invention of claim 9 including establishing openings in the substrate, with the openings spaced from one another along the length of the substrate so as to be registered with one another in the juxtaposed shorter lengths for establishing at least one cavity in the folded substrate, and placing at least one of the components of the circuitry within the cavity.

14. The invention of claim 9 wherein others of the components of the circuitry are mounted externally upon the folded substrate.

15. The invention of claim 9 including encasing the folded substrate within an external sheath.

* * * * *